United States Patent [19]
Sato et al.

[11] Patent Number: 5,907,221
[45] Date of Patent: May 25, 1999

[54] INDUCTIVELY COUPLED PLASMA REACTOR WITH AN INDUCTIVE COIL ANTENNA HAVING INDEPENDENT LOOPS

[75] Inventors: Arthur H. Sato, Santa Clara; Xue-Yu Qian, Milpitas, both of Calif.

[73] Assignee: Applied Materials, Inc., Santa Clara, Calif.

[21] Appl. No.: 08/515,695

[22] Filed: Aug. 16, 1995

[51] Int. Cl.$^6$ ........................................... H01J 7/24
[52] U.S. Cl. .................. 315/111.51; 315/111.21; 118/723 MP
[58] Field of Search ............... 315/111.21, 111.51; 118/723 MP, 723 IR, 723 I

[56] References Cited

U.S. PATENT DOCUMENTS

| | | |
|---|---|---|
| 3,569,777 | 3/1971 | Beaudry .............................. 315/111.21 |
| 4,498,548 | 2/1985 | Ogle . |
| 5,187,454 | 2/1993 | Collins et al. . |
| 5,285,046 | 2/1994 | Hansz ................................. 315/111.51 |
| 5,346,578 | 9/1994 | Benzing et al. . |
| 5,349,313 | 9/1994 | Collins et al. . |
| 5,392,018 | 2/1995 | Collins et al. . |
| 5,401,350 | 3/1995 | Patrick et al. ........................ 118/723 I |
| 5,464,476 | 11/1995 | Gibb et al. ........................ 118/723 MP |
| 5,540,824 | 7/1996 | Yin et al. ............................ 118/723 IR |
| 5,554,223 | 9/1996 | Imahashi ............................ 315/111.51 |
| 5,558,722 | 9/1996 | Okumura et al. ..................... 118/723 I |
| 5,653,811 | 8/1997 | Chan ................................... 118/723 I |

FOREIGN PATENT DOCUMENTS

| | | |
|---|---|---|
| 459177 | 4/1991 | European Pat. Off. . |
| 7161695 | 6/1995 | Japan . |
| 8078191 | 3/1996 | Japan . |

*Primary Examiner*—Robert Pascal
*Assistant Examiner*—Michael B. Shingleton
*Attorney, Agent, or Firm*—Robert Wallace

[57] ABSTRACT

An inductively coupled plasma reactor for processing a substrate has an inductively coupled coil antenna including plural inductive antenna loops which are electrically separated from one another and independently connected to separately controllable plasma source RF power supplies. The RF power level in each independent antenna loop is separately programmed and instantly changeable to provide a perfectly uniform plasma ion density distribution across the entire substrate surface under a large range of plasma processing conditions, such as different process gases or gas mixtures. In a preferred embodiment, there are as many separately controllable RF power supplies as there are independent antenna loops, and all the separately controllable power supplies receive their RF power from a commonly shared RF generator.

15 Claims, 3 Drawing Sheets

INDUCTIVELY COUPLED PLASMA REACTOR WITH AN INDUCTIVE COIL ANTENNA HAVING INDEPENDENT LOOPS

BACKGROUND OF THE INVENTION

1. Technical Field

The invention is related to radio frequency (RF) plasma reactors for processing semiconductor wafers, flat panel display wafer or substrates generally, and in particular to inductively coupled RF plasma reactors and improvements increasing the uniformity of the plasma ion density across the entire surface of large substrates.

2. Background Art

RF plasma reactors are employed in performing various processes on semiconductor wafers, including etching processes and chemical vapor deposition processes, for example. An inductively coupled RF plasma reactor typically has an inductive coil antenna wound around the reactor chamber and connected to a plasma source RF power supply. Such an inductively coupled plasma reactor is particularly useful because it can achieve a very high plasma ion density for high production throughput, while avoiding a concomitant increase in ion bombardment damage of the wafer.

One problem with inductively coupled plasma reactors is that the plasma ion density distribution can vary greatly, depending upon various parameters including the particular process gas or gas mixture introduced into the reactor chamber. For example, the plasma ion density may be high at the wafer center and low at the wafer periphery for one process gas, while for another process gas it may be the opposite pattern (i.e., low at the wafer center and high at the wafer periphery). As a result, the antenna design must be customized for each different process or process gas to provide an acceptable degree of plasma ion density uniformity across the wafer surface, a significant problem.

If the plasma reactor is employed in processing a large flat panel display wafer (comprising a glass substrate), for example, the large surface area of the substrate prevents achievement of good plasma ion density uniformity across the substrate surface without extraordinary care in customizing the antenna design.

It is therefore an object of the present invention to provide a uniform plasma ion density across an entire substrate surface in an inductively coupled plasma reactor without requiring installation of a completely new antenna in the plasma reactor.

SUMMARY OF THE DISCLOSURE

An inductively coupled plasma reactor for processing a substrate has an inductively coupled coil antenna including plural inductive antenna loops which are electrically separated from one another and can be connected to independent RF power supplies. The RF power level in each independent antenna loop is separately programmed and instantly changeable to provide a perfectly uniform plasma ion density distribution across the entire substrate surface under a large range of plasma processing conditions, such as different process gases or gas mixtures and/or absorbed RF power levels. In a preferred embodiment, there are as many independent RF power regulating circuit elements as there are independent antenna loops, and all the independent RF power regulating circuit elements receive RF power from a commonly shared RF generator. In this preferred embodiment, a variable reactance element is connected in series with each independent antenna loop, so that all antenna loops are separately and instantaneously controlled. Typically, the independent antenna loops are over the ceiling of the reactor chamber, while a wafer pedestal near the chamber floor supports the substrate being processed. In an alternative embodiment, a separate RF generator is provided for each independent antenna loop.

In accordance with another aspect of the invention, the plasma reactor is a capacitively coupled reactor, having a pair of electrodes, including a cathode near the floor of the reactor chamber underlying the substrate being processed, and an anode at the top or over the ceiling of the reactor chamber, the anode consisting of plural independent electrode segments connected to separately controllable RF power sources.

DETAILED DESCRIPTION OF THE PREFERRED EMBODIMENTS

Figure 1:
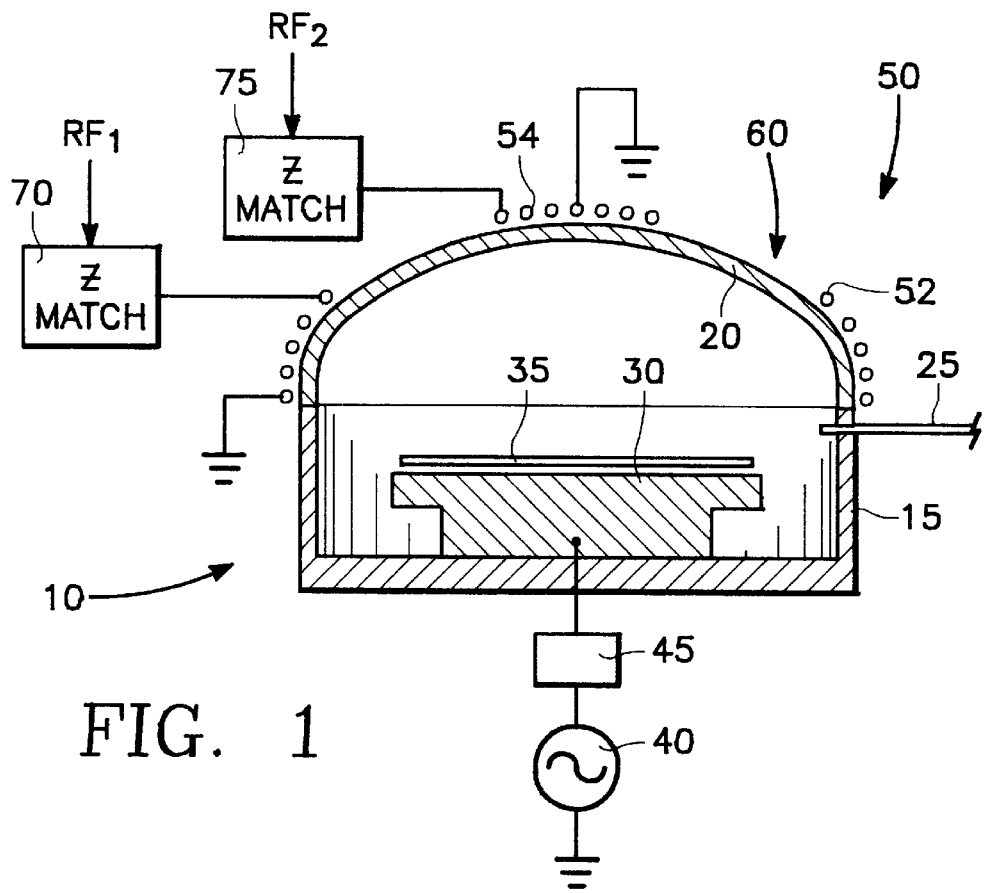
FIG. 1 is an elevational view of an inductively coupled plasma reactor in accordance with a first embodiment of the invention.
Figure 2:
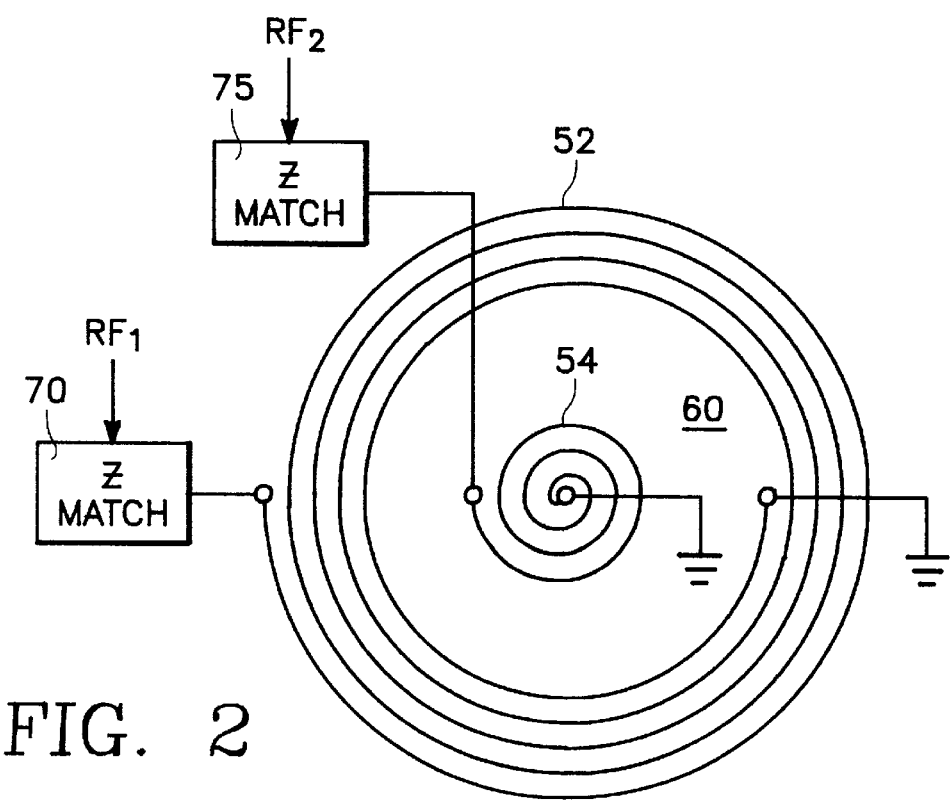
FIG. 2 is a top view corresponding to FIG. 1.

Referring to the embodiment of FIGS. 1 and 2, an inductively coupled RF plasma reactor has a vacuum chamber 10 having a generally cylindrical side wall 15 and a dome shaped ceiling 20. A gas inlet tube 25 supplies process gas (e.g., chlorine for etch processing) into the chamber 10. A wafer pedestal 30 supports a substrate such as semiconductor wafer 35 near the floor of the chamber 10. A bias RF power supply 40 connected to the pedestal 30 through a conventional RF impedance match network 45 controls the plasma ion density at the top surface of the wafer 35. A plasma is ignited and maintained within the chamber 10 by RF power inductively coupled from a coil antenna 50 consisting of a pair of independent (electrically separate) antenna loops 52, 54 wound around different portions of the dome-shaped ceiling. In the embodiment of FIG. 1, both loops are wound around a common axis of symmetry coincident with the axis of symmetry of the dome-shaped ceiling 20 and the axis of symmetry of the wafer pedestal 30 and wafer 35. The antenna loop 52 is of the conventional type typically employed in an inductively coupled reactor and is wound around the bottom portion of the dome-shaped ceiling 20, leaving an aperture 60 surrounded by the antenna loop 52. The other antenna loop 54 is placed over the ceiling 20 in the center of the aperture 60. Separately controlled RF signals RF1 and RF2 are applied through RF impedance match networks 70, 75 to respective ones of the independent antenna loops 52, 54, so that RF power in each loop 52, 54 is separately controlled. The RF power signal RF1 applied to the outer antenna loop 52 predominantly affects plasma ion density near the periphery of the wafer 35 while the RF power signal RF2 applied to the inner antenna loop 54 predominantly affects plasma ion density near the center of the wafer 35. Thus, for example, where it is found in an etch process performed with the reactor of FIG. 1 that the etch rate at the wafer center is less than the etch rate at the wafer periphery, the power of the RF signal RF2 on the inner antenna loop 54 is increased until the center and periphery etch rates are at least nearly equal. Likewise, if the center etch rate is found to be higher than the periphery etch rate, then the RF signal RF2 on the inner antenna loop 54 is decreased (or the RF signal on the outer antenna loop 52 is increased) until uniformity of plasma ion distribution is at least nearly achieved.

Thus, the same RF plasma reactor can be employed over a large range of different process parameters (including a large choice of process gases) tending to have different plasma ion density distribution patterns that must be compensated differently. The same plasma reactor is capable of compensating for the different plasma ion density distribution patterns characteristic of different plasma processes.

Figure 3:
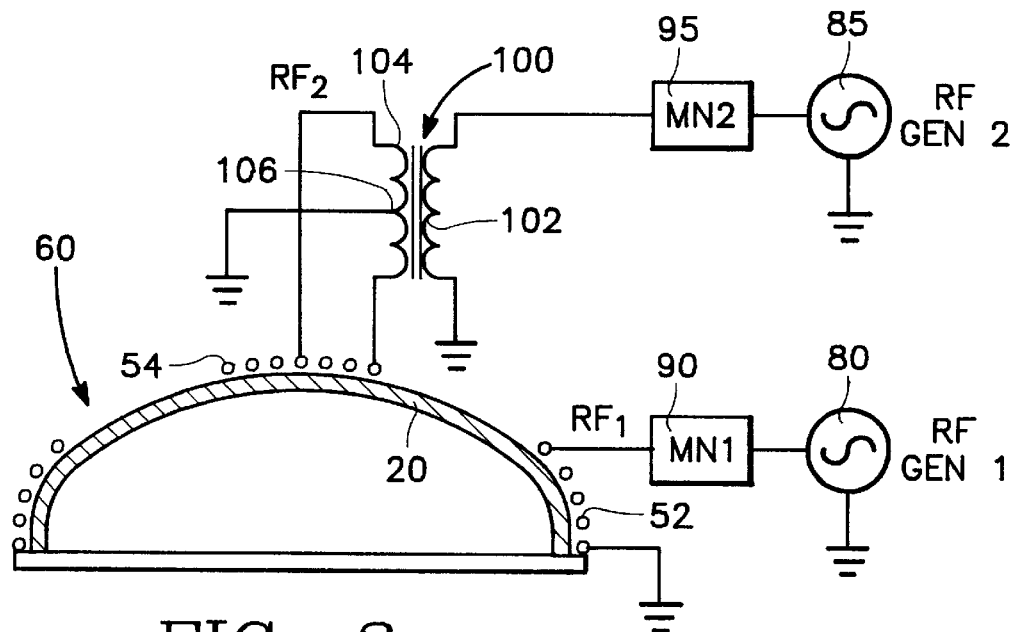
FIG. 3 is a schematic diagram illustrating a first RF power distribution circuit for the embodiment of FIG. 1.

Referring to FIG. 3, each antenna loop 52, 54 may be provided with its own RF power generator 80, 85 and RF impedance match network 90, 95 connected in series between the respective RF power generator 80, 85 and antenna loop 52, 54. In accordance with one aspect of the invention, the RF impedance match network (e.g., the RF impedance match network 95) may be coupled to the antenna loop (e.g., the inner antenna loop 54) through a transformer, such as the transformer 100 shown in FIG. 3. In the embodiment of FIG. 3, the transformer 100 has a primary winding 102 connected to the output of the impedance match network 95 and a secondary winding 104 connected across the inner antenna loop 54. To provide a potential reference for the inner antenna loop 54, a ground tap 106 is connected to the center of the secondary winding 104. The advantage of this method of powering the antenna loop 54 is that it minimizes capacitive coupling to the plasma by reducing the peak voltage (with respect to ground) on the antenna loop 54. A general advantage of the embodiment of FIG. 3 is that the RF frequencies at each of the independent antenna loops 52, 54 are separately controllable so that the same RF frequency may be applied to both loops 52, 54 or else different RF frequencies may be applied to the loops 52, 54.

Figure 4:
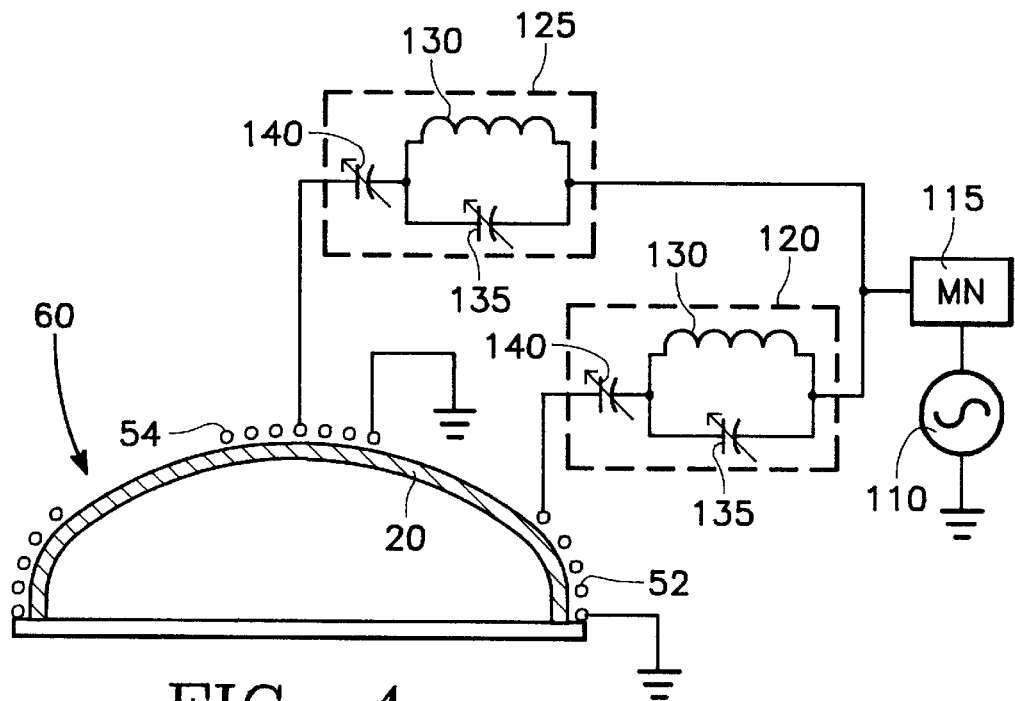
FIG. 4 is a schematic diagram illustrated a second RF power distribution circuit having a single commonly shared RF power generator for the inductive coil antenna of the embodiment of FIG. 1.

Preferably, a common RF generator powers both antenna loops 52, 54, the RF power in each loop 52, 54 being separately controlled, as in the embodiment of FIG. 4. This feature has the advantage of simplicity and cost effectiveness. In FIG. 4, the single RF generator 110 is coupled through an RF impedance match network 115 to a pair of variable reactive circuits 120, 125 which in turn coupled RF power to the respective outer and inner antenna loops 52, 54. Each one of the variable reactive circuits 120, 125 consists of an inductor 130 and variable capacitor 135 connected in parallel, a second variable capacitor 140 being connected in series with the combination of the parallel inductor and capacitor 130, 135. The variable capacitors in each variable reactive circuit 120, 125 permit the RF power level to be separately adjusted in each of the independent antenna loops 52, 54.

There may be more than two independent antenna loops. Moreover, the plural independent antenna loops may be either symmetrically wound relative to a common axis of symmetry, as in the embodiment of FIGS. 1–4, or may be wound around separate axes and thus centered at different points distributed across the ceiling, as in the embodiment of FIGS. 5 and 6.

Figure 5:
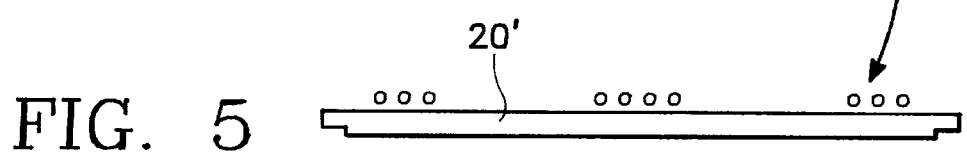
FIG. 5 is an elevational view of a portion of an inductively coupled plasma reactor in accordance with a second embodiment of the invention.
Figure 6:
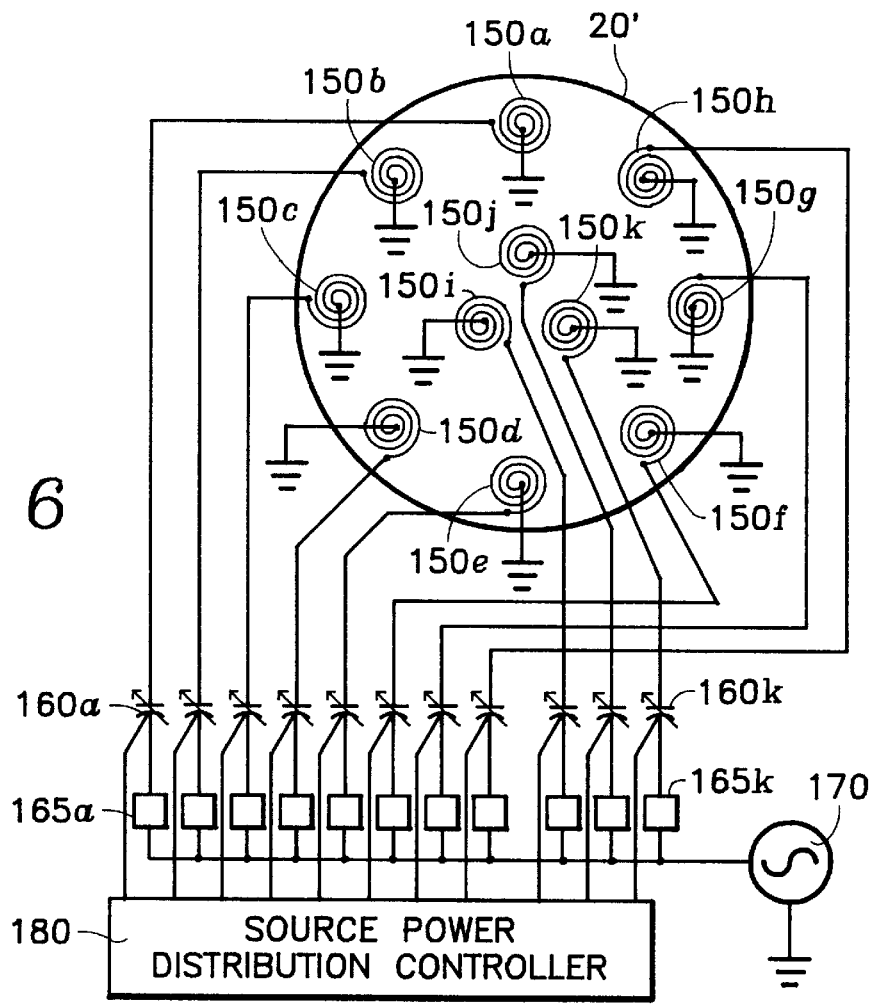
FIG. 6 is a top view corresponding to FIG. 5 and further illustrating in schematic form an RF power distribution circuit having a single commonly shared RF power generator.

Referring to FIGS. 5 and 6, the reactor may have a flat ceiling 20'. In this example, there are eight outer antenna loops 150a–150h centered at uniform intervals along an outer radius and three inner antenna loops 150i–150k. Each loop 150 has a diameter which only a small fraction (e.g., $\frac{1}{10}$) of the diameter of the wafer 35. The inner end of each antenna loop 150 is grounded while the outer end is connected through a respective one of a bank of variable capacitors 160a–160k and through respective reactive networks 165a–165k to a single commonly shared RF generator 170. The reactive networks may, for example, be RF impedance match networks. Control over each individual variable capacitor 160 in the bank of variable capacitors 160a–160k is exercised by a source power distribution controller 180. The user governs the RF power levels in each one of the independent antenna loops 150a–150k through the controller 180. A greater of lesser number of antenna loops may be employed than illustrated here. The reactor ceiling 20' is flat in this example, but it may also be domed, cylindrical or some other shape. Preferably, the independent loops are arranged symmetrically with respect to the reactor ceiling and substrate pedestal or processing substation.

Figure 7:
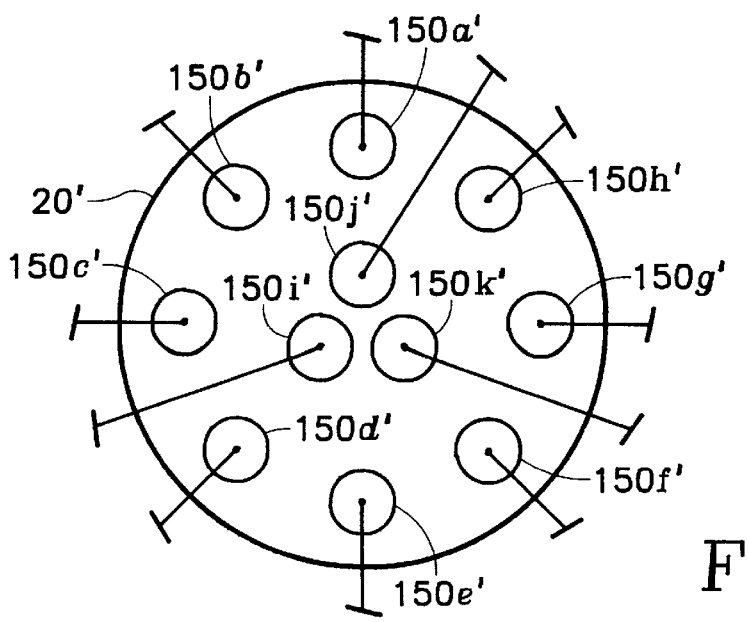
FIG. 7 is a top view of a capacitively coupled RF plasma reactor in accordance with an alternative embodiment of the invention.

Referring to the alternative embodiment of FIG. 7, each of the independent loops 150a–150k may be replaced by small disk-shaped independent electrodes 150'a–150'k of the approximately the same diameter as the independent loop which it replaces. In FIG. 7, the RF plasma reactor is a capacitively coupled reactor. For this purpose, the wafer pedestal may be either grounded or connected to the separate RF power generated 40 as illustrated in FIG. 1. The independent electrodes together function as an anode electrode array while the wafer pedestal functions as the cathode of the capacitively coupled RF plasma reactor.

While the invention has been described in detail by specific reference to preferred embodiments, it is understood that variations and modifications thereof may be made without departing from the true spirit and scope of the invention.

What is claimed is:

1. An inductively coupled plasma reactor for processing a substrate in a reactor chamber containing a process gas, comprising:

a wafer pedestal;

an inductively coupled coil antenna, said coil antenna comprising plural inductive antenna loops adjacent different portions of said chamber and which are electrically separate from one another;

said plural inductive antenna loops comprising respective conductors wound around respective loop axes, all of said respective loop axes being substantially aligned with an axis of symmetry of said wafer pedestal;

plural RF power level adjusting circuits each connected to a respective one of the antenna loops and connected to receive respective RF power signals, each of the RF power level adjusting circuits being capable of changing and setting a RF power level of the RF power signal;

an RF power distribution controller connected to each of the RF power level adjusting circuits, said controller being capable of simultaneously controlling each of the RF power level adjusting circuits to individually govern the RF power level of each of the RF power signals to provide a uniform plasma ion density distribution across the top surface of the substrate;

a transformer; and an RF impedance match network coupled to at least one of said plural inductive antenna loops through said transformer.

2. The reactor of claim 1 wherein said transformer further comprises:

a primary winding connected to the output of said RF impedance match network; and a secondary winding connected to at least one of said plural inductive antenna loops.

3. An inductively coupled plasma reactor for processing a substrate in a reactor chamber containing a process gas, comprising:

an inductively coupled coil antenna, said coil antenna comprising plural inductive antenna loops adjacent different portions of said chamber and which are electrically separate from one another;

a transformer; and an RF impedance match network coupled to at least one of said plural inductive antenna loops through said transformer.

4. The reactor of claim 3 wherein said transformer further comprises:

a primary winding connected to the output of said RF impedance match network; and a secondary winding connected to at least one of said plural inductive antenna loops.

5. The reactor of claim 3 further comprising:

plural RF power level adjusting circuits each connected to a respective one of the antenna loops and connected to receive respective RF power signals, each of the RF power level adjusting circuits being capable of changing and setting a RF power level of the RF power signal associated therewith; and a RF power distribution controller connected to each of the RF power level adjusting circuits, said controller being capable of simultaneously controlling each of the RF power level adjusting circuits to individually govern the RF power level of each of the RF power signals to provide a uniform plasma ion density distribution across the top surface of the substrate.

6. The reactor of claim 5 further comprising RF power circuitry connected to said plural RF power level adjusting circuits for producing said respective RF power signals from a common RF generator.

7. The reactor of claim 5 further comprising plural RF power generators for providing said respective RF power signals.

8. The reactor of claim 7 wherein at least two of sad respective RF power signals exhibit different frequencies.

9. The reactor of claim 6 wherein said reactor comprises:

a ceiling, wherein said plural independent antenna loops are disposed over said ceiling; and a wafer pedestal near the chamber floor supporting said substrate.

10. The reactor of claim 9 wherein said plural independent antenna loops comprise respective conductors wound around respective loop axes, all of said respective loop axes being coincident with an axis of symmetry of said wafer pedestal.

11. The reactor of claim 10 wherein said reactor ceiling is dome-shaped and wherein said axis of symmetry is coincident with an axis of symmetry of said dome-shaped ceiling.

12. The reactor of claim 9 wherein said plural independent antenna loops comprise respective conductors wound around respective loop axes, said respective loop axes being distributed among different points over said ceiling, said loops having diameters less than that of said wafer.

13. The reactor of claim 12 wherein said diameters are a relatively small fraction of the diameter of said wafer and whereby each loop primarily affects a plasma ion density at a small local region over said wafer.

14. The reactor of claim 9 wherein said antenna loops are centered at intervals along plural radii of said ceiling, said plural radii being centered relative to said wafer pedestal.

15. The reactor of claim 14 wherein said intervals are uniform.

* * * * *